United States Patent [19]

Kato et al.

[11] Patent Number: 4,677,042

[45] Date of Patent: Jun. 30, 1987

[54] MASK STRUCTURE FOR LITHOGRAPHY, METHOD FOR PREPARATION THEREOF AND LITHOGRAPHIC METHOD

[75] Inventors: Hideo Kato; Masaaki Matsushima, both of Yokohama; Keiko Matsuda, Machida; Hirofumi Shibata, Yokohama, all of Japan

[73] Assignee: Canon Kabushiki Kaisha, Tokyo, Japan

[21] Appl. No.: 794,180

[22] Filed: Nov. 1, 1985

[30] Foreign Application Priority Data

| Nov. 5, 1984 | [JP] | Japan | 59-231279 |
| Nov. 13, 1984 | [JP] | Japan | 59-237615 |
| Nov. 15, 1984 | [JP] | Japan | 59-239455 |
| Nov. 19, 1984 | [JP] | Japan | 59-242418 |
| Nov. 26, 1984 | [JP] | Japan | 59-248162 |
| Dec. 13, 1984 | [JP] | Japan | 59-261838 |

[51] Int. Cl.$^4$ ............................................. G03F 9/00
[52] U.S. Cl. ........................................ 430/5; 430/321; 430/967; 428/698; 428/446; 428/473.5; 428/480; 428/500; 378/34; 378/35
[58] Field of Search .................. 430/5, 321, 966, 967; 428/698, 446, 473.5, 480, 500; 378/34, 35

[56] References Cited

U.S. PATENT DOCUMENTS 4,293,624  10/1981  Buckley .................................. 430/5
4,497,878   2/1985  Hatano et al. ...................... 428/698

Primary Examiner—John E. Kittle
Assistant Examiner—José G. Dees
Attorney, Agent, or Firm—Fitzpatrick, Cella, Harper & Scinto

[57] ABSTRACT

A mask structure for lithography has a ring frame holding the peripheral portion of a thin film for holding a mask material, the mask material holding thin film comprising a layer of aluminum nitride.

32 Claims, 59 Drawing Figures

FIG.I(a)
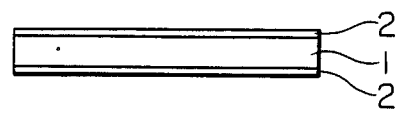
FIG.I(f)
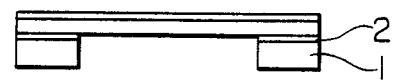
FIG.I(b)
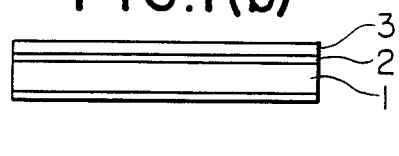
FIG.I(g)
FIG.I(c)
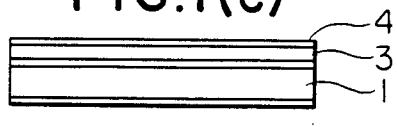
FIG.I(h)
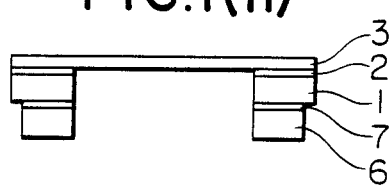
FIG.I(d)
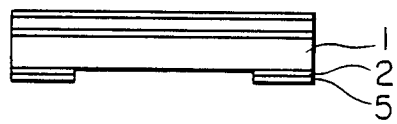
FIG.I(e)
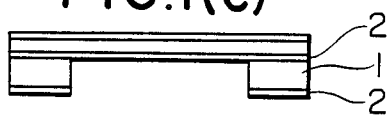

FIG. 7(a)
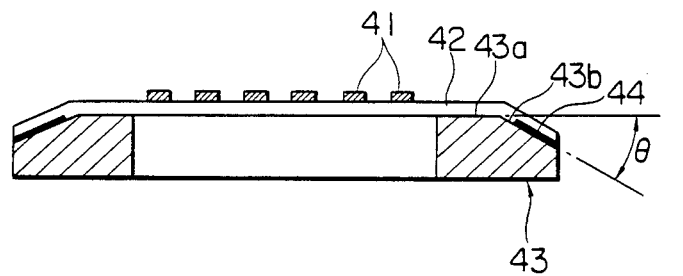
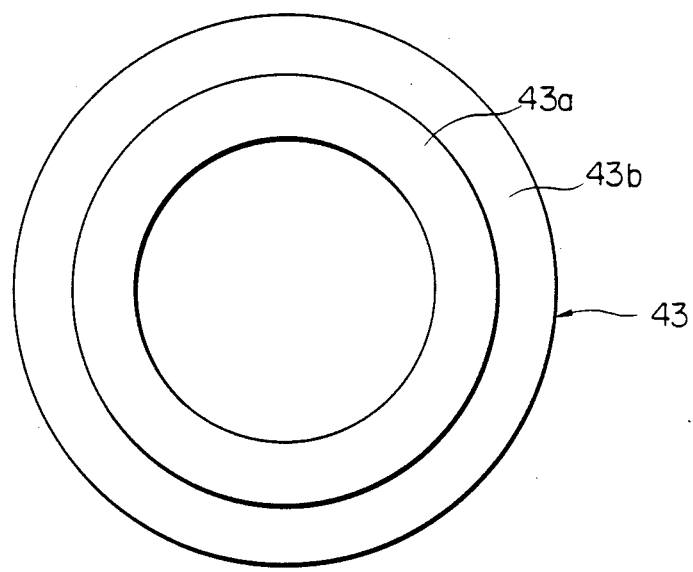
FIG. 7(b)

and FIG. 10(b) is a schematic plan view of the ring frame of the mask structure for lithography.

MASK STRUCTURE FOR LITHOGRAPHY, METHOD FOR PREPARATION THEREOF AND LITHOGRAPHIC METHOD

BACKGROUND OF THE INVENTION

1. Field of the Invention

This invention relates to a mask structure for lithography, a method for preparation thereof and a lithographic method by use of the mask structure for lithography, and more particularly to a mask structure for lithography suitable for projecting a mask pattern on a wafer coated with a photosensitive agent for production of semiconductors, a method for preparation thereof and a lithographic method by use of said mask structure for lithography.

2. Description of the Prior Art

X-ray lithography provides a number of characteristics improving on lithography by visible light or UV-ray, such as the rectilinear propagation characteristic, incoherence, low diffraction characteristic, etc., and is attracting attention as a powerful means for submicron lithography.

While X-ray lithography has a number of superior points as compared with lithography by visible light or UV-ray, it involves drawbacks such as insufficient power of X-ray source, low sensitivity of resist, difficulty in alignment, difficulty in choice of mask material and working method, whereby productivity is low and cost is high, thus restricting its practical application.

Among them, referring now to the mask to be used for X-ray lithography, in lithography by visible light or UV-ray, glass plates and quartz plates have been utilized as the mask material holding member (namely light-transmitting member). However, in X-ray lithography, the wavelength of the ray which can be utilized is 1 to 200 Å. The glass plates or quartz plates hitherto used substantially absorb the ray in this X-ray wavelength region, and as the thickness must be made as great as 1 to 2 mm, the X-ray cannot sufficiently be transmitted. These materials are therefore unsuitable as the material for the mask material holding member to be used for X-ray lithography.

X-ray transmittance generally depends on the density of a material, and therefore inorganic materials or organic materials with low density are being investigated as the material for the mask material holding member to be used for X-ray lithography. Such materials may include, for example, inorganic materials such as simple substances of beryllium (Be), titanium (Ti), silicon (Si) and boron (B), and compounds thereof, or organic compounds such as polyimide, polyamide, polyester, poly-p-xylylene, etc.

For practically using these substances as the material of the mask material holding member to be used for X-ray lithography, they are required to be made into thin films for maximizing the amount of X-ray transmitted, to a thickness of serveral microns or less in the case of an inorganic material and several tens of microns or less in the case of an organic material. For this reason, in forming, for example, a mask material holding member comprising a thin film of an inorganic material, or a composite film thereof, there is proposed the method in which a thin film of $Si_3N_4$, $SiO_2$, BN, SiC, etc. is formed by vapor deposition, etc., on a silicon wafer which is excellent in flatness, and thereafter the silicon wafer is removed by etching.

On the other hand, as the mask material (namely the X-ray absorbing material) to be used for X-ray lithography held on the mask material holding member as described above, it is preferable to use a thin film of a material having high density such as gold, platinum, tungsten, tantalum, copper, nickel, etc., preferably a thin film with a thickness of 0.5 to $1\mu$. Such a mask can be prepared by, for example, forming a thin film of the above high density material uniformly on the above mask material holding member, then applying a resist thereon, effecting a desired pattern drawing on the resist by electron beam, light, etc., and thereafter forming a desired pattern by means of etching, etc.

And, in the X-ray lithography of the prior art as described above, the X-ray transmittance through the mask material holding member is low, and the mask material holding member is required to be made considerably, thinner in order to obtain a sufficient amount of X-ray transmittance. Presentation of such a thin prior art mask material holding member is difficult.

SUMMARY OF THE INVENTION

It is, therefore, an object of the present invention to provide a mask material holding thin film having good X-ray transmittance, thereby providing excellent lithography in view of the prior art as described above.

According to one aspect of the present invention, there is provided a mask structure for lithography having a ring frame for holding the peripheral portion of a thin film for holding a mask material, the mask material holding thin film comprising a layer of aluminum nitride, and a lithographic method by use of the mask structure for lithography.

According to another aspect of the present invention, there is provided a process for preparing a mask structure for lithography comprising the steps of:

forming a mask material holding thin film comprising a layer of aluminum nitride on a substrate;

adhering a ring frame to said mask material holding thin film; and removing said substrate from said mask material holding thin film.

BRIEF DESCRIPTION OF THE DRAWINGS

FIG. 1(a)-(h), FIG. 2(a)-(h), FIG. 3(a)-(h), FIG. 4(a)-(h) and FIG. 5(a)-(h) are schematic central longitudinal sectional views each showing the preparation steps of an example of the mask structure for lithography according to the present invention.

FIG. 7(a) is a schematic central longitudinal sectional view showing an example of the mask structure for lithography according to the present invention, and FIG. 7(b) is a schematic plan view of the ring frame of the mask structure for lithography.

DETAILED DESCRIPTION OF THE PREFERRED EMBODIMENTS

Figure 2A:
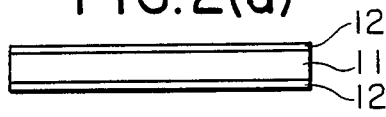

For accomplishing the above objects, in the present invention, a layer of aluminum nitride is used as the constituent element of the mask material holding thin film of the mask structure for lithography. Aluminum nitride has specific features of high X-ray transmittance and visible light transmittance (about 0.1 of optical density through 1 $\mu$m thickness), low coefficient of thermal expansion ($3\text{-}4 \times 10^{-6}/^\circ$ C.), high coefficient of thermal conductivity and good film forming property, and therefore it is good as the mask material holding thin film of the mask structure for lithography.

The mask material holding thin film may be either a single layer film of aluminum nitride or a laminated film of a layer of aluminum nitride and a layer of an organic material and/or a layer of an inorganic material other than aluminum nitride.

In the case of using a laminated film of a layer of aluminum nitride and a layer of an organic material as the mask material holding thin film of the mask structure for lithography, the mask material holding thin film can be made to have characteristics possessed by the organic material in addition to the characteristics of the aluminum nitride as described above. More specifically, the mask material holding thin film, in addition to the effect possessed by the mask material holding thin film comprising a single layer film of aluminum nitride, has the characteristics of greater strength and substantial absence of stress.

As the organic material constituting the above laminated film in the present invention, it is possible to use those having at least a film forming property and an X-ray transmitting ability. Such organic materials may be exemplified by polyimide, polyamide, polyester and, poly-p-xylylene (trade name: Parylene, produced by Union Carbide Co.). Among them, polyimide is particularly preferable for its overall performances characteristics, such as heat resistance, impact resistance, and visible light transmitting ability.

In the case of using a laminate film of a layer of aluminum nitride and a layer of an inorganic material different from aluminum nitride as the mask material holding thin film, a mask material holding thin film having the characteristics of the inorganic material in addition to the characteristics of aluminum nitride as described above can be obtained. That is, such a mask material holding thin film also has excellent light transmittance and thermal conductivity as well as relatively great strength and chemical resistance. Also, when further laminated with a layer of an organic material, the specific features such as greater strength and substantial absence of stress are added.

In the present invention, as the inorganic material constituting the above laminated film, there may be employed those having at least a film forming property and an X-ray transmitting ability. Such materials may include, for example, boron nitride, silicon nitride, silicon oxide, silicon carbide, titanium, etc.

When boron nitride which is particularly excellent in chemical resistance is laminated as the protective film of an aluminum nitride film, there can be obtained a laminated film which is very excellent in film characteristics, such as X-ray transmitting ability, light transmitting ability, thermal conductivity, electroconductivity, chemical resistance, etc.

The laminated film constituting the above mask material holding thin film may consist of two layers, a layer of aluminum nitride and a layer of an organic material, or alternatively three or more layers, as a whole having at least one aluminum nitride layer and at least one organic material layer.

The laminated film constituting the above mask material holding thin film may consist of two layers, a layer of aluminum nitride and a layer of an inorganic material different from aluminum nitride, or alternatively, three or more layers, as a whole having at least one aluminum nitride layer and at least one layer of an inorganic material different from aluminum nitride.

Further, the laminated film constituting the above mask material holding thin film may also consist of three or more layers having at least one layer of aluminum nitride at least one, layer of an inorganic material different from aluminum nitride and at least one layer of an organic material.

The thickness of the mask material holding thin film according to the present invention is not particularly limited, but it can be made to have a suitable thickness, for example, advantageously about 2 to 20 $\mu$m.

The ring-shaped holding substrate (ring frame) in the mask structure for lithography of the present invention comprises, for example, silicon, glass, quartz, phosphor bronze, brass, nickel, stainless steel, etc. As the mask material, there may be employed a thin film with a thickness of about 0.5 to 1 $\mu$m such as of gold, platinum, nickel, palladium, rhodium, indium, tungsten, tantalum, copper, etc.

The mask structure for lithography as mentioned in the present invention is inclusive of all the three kinds of:

(1) a structure having a mask material holding thin film and a ring-shaped holding substrate for holding the peripheral portion of the mask material holding thin film;

(2) a structure having further a mask material applied as a thin film on one surface of the above mask material holding thin film; and (3) a structure in which the above mask material is formed in a pattern.

The mask structure for lithography according to the present invention can be prepared according to the preparation method of the prior art by, for example, forming a mask material holding thin film containing a layer of aluminum nitride as the constituent element on a silicon wafer, forming a patterned mask material thereon, and then etching its central portion from the backside of the silicon wafer, whereby the desired objects are sufficiently accomplished. However, the present invention further has an object to provide a process for preparing a mask structure for lithography, the preparation steps of which are simple, rapid and high yielding, in addition to the above objects.

The process for preparing a mask structure for lithography for accomplishing such an object comprises the steps of:

forming a mask material holding thin film comprising a layer of aluminum nitride on a substrate;

adhering a ring frame to said mask material holding thin film; and removing said substrate from said mask material holding thin film.

The mask structure for lithography according to the present invention can sufficiently accomplish its desired objects by taking a form in which the mask material holding thin film having a layer of aluminum nitride as the constituent element is adhered on the uppermost flat end plane of the ring-shaped holding substrate, but the present invention further has an object to provide a mask structure for lithography further improved in flatness of the mask material holding thin film in addition to the above objects.

The mask structure for lithography of the present invention for accomplishing such an object has a mask material holding thin film comprising a layer of aluminum nitride and a ring-shaped holding substrate for holding the peripheral portion of the mask material holding thin film, the mask material holding thin film being adhered to the ring-shaped holding substrate at a position lower than the uppermost flat end plane.

In the following, the present invention is described in more detail by referring to the drawings.

EXAMPLE 1

FIGS. 1(a) to (h) are schematic central longitudinal cross-sectional views showing the steps for preparation of an example of the mask structure for lithography according to the present invention.

As shown in FIG. 1(a), a silicon oxide film 2 with a thickness of 1 μm was formed on each of both surfaces of a circular silicon wafer 1 of 10 cm in diameter.

Next, as shown in FIG. 1(b), by means of a thermoelectron shock type ion plating device, an aluminum nitride AlN film 3 with a thickness of 3 μm was formed on the silicon oxide film 2 on one side of the silicon wafer 1 according to the ion plating method under the condition of an aluminum target, an $N_2$ atmosphere, a bias voltage of 900 V and a vapor deposition pressure of $2 \times 10^{-4}$ Torr.

Next, as shown in FIG. 1(c), a tar type paint layer 4 for protection was formed on the aluminum nitride film 3.

Next, as shown in FIG. 1(d), the central circular portion of 7.5 cm in diameter of the silicon oxide film 2 exposed was removed by use of a mixture of ammonium fluoride and hydrofluoric acid. In this treatment, in order to permit the silicon oxide film 2 to remain in the shape of a ring, a layer of Apiezon wax 5 (produced by Shell Chemical Co.) was formed at that portion, followed by removal of the Apiezon wax layer 5 after removal of the central portion of the silicon oxide film.

Next, as shown in FIG. 1(e), electrolytic etching (current density 0.2 A/dm$^2$) was effected with 3% aqueous hydrofluoric acid to remove the exposed central circular portion of 7.5 cm in diameter of the silicon wafer 1.

Next, as shown in FIG. 1(f), the silicon oxide film 2 at the exposed portion was removed by use of a mixture of ammonium fluoride and hydrofluoric acid.

Next, as shown in FIG. 1(g), one surface of a ring frame 6 (made of Pyrex, inner diameter 7.5 cm, outer diameter 9 cm, thickness 5 mm) was coated with an epoxy type adhesive 7, and the surface coated with the adhesive was adhered to the side of silicon wafer 1 opposite to that where the aluminum nitride film 3 was formed.

Next, as shown in FIG. 1(h), the tar type paint layer 4 was removed with acetone.

Thus, a mask structure for lithography having the aluminum nitride film 3 fixed on the ring frame 6 and the silicon wafer 1 was obtained.

EXAMPLE 2

In the steps of Example 1, after formation of the aluminum nitride film, a layer of a photoresist RD-200N (produced by Hitachi Kasei Co.) was formed on said aluminum nitride film to a thickness of 1.2 μm by spin coating.

Next, after the resist was baked by far UV-ray by use of a quartz-chromium mask, predetermined treatment was performed to obtain a resist pattern of negative form relative to the mask.

Next, by means of an electron beam vapor deposition machine, tantalum (Ta) was vapor deposited on said resist pattern to a thickness of 0.5 μm.

Next, the resist was removed with a remover and a Ta film pattern was obtained according to the lift-off method.

Next, a tar type paint layer was formed on the aluminum nitride film in the same manner as in Example 1.

Subsequently, the same steps as in Example 1 were carried out to obtain a mask structure for lithography having a mask material holding thin film consisting of an aluminum nitride film and a Ta film pattern fixed on the ring frame and the silicon wafer.

EXAMPLE 3

FIGS. 2(a) to (h) are schematic central longitudinal cross-sectional views showing the steps for preparation of an example of the mask structure for lithography according to the present invention.

As shown in FIG. 2(a), a silicon oxide film 12 with a thickness of 1 μm was formed on each of both surfaces of a circular silicon wafer 11 of 10 cm in diameter.

Figure 2F:
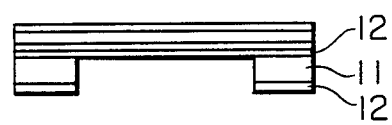
Figure 2B:
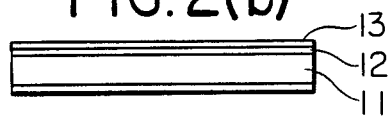

Next, as shown in FIG. 2(b), after PIQ liquid (polyimide precursor, produced by Hitachi Kasei Co.) was applied by spin coating on the silicon oxide film 12 on one side of the silicon wafer 11, the coated film was cured at 50° to 350° C. for 4 hours to form a polyimide film 13 with a thickness of 2 μm.

Figure 2G:
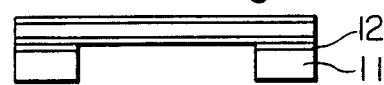
Figure 2C:
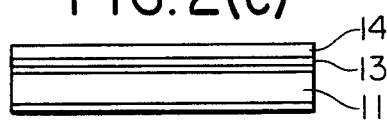

Next, as shown in FIG. 2(c), an aluminum nitride film 14 with a thickness of 2 μm was formed on the polyimide film 13 according to the reactive sputtering method under the condition of an aluminum (Al) target, a gas composition of argon (Ar):nitrogen ($N_2$) = 1:1 and a discharging power of 100 W.

Figure 2H:
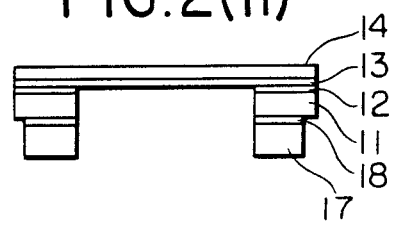
Figure 2D:
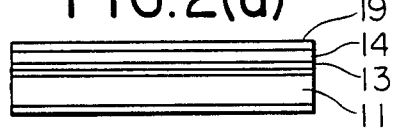

Next, as shown in FIG. 2(d), a tar type paint layer 19 for protection was formed on the aluminum nitride film 14.

Figure 2E:
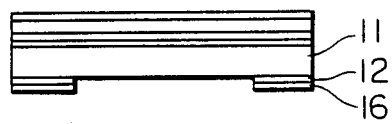

Next, as shown in FIG. 2(e), the central circular portion of 7.5 cm in diameter of the exposed silicon oxide film 12 was removed by use of a mixture of ammonium fluoride and hydrofluoric acid. In this treatment, in order to permit the silicon oxide film 12 to remain in shape of a ring, a layer of Apiezon wax 16 (produced by Shell Chemical Co.) was formed at that portion, followed by removal of the Apiezon wax layer 16 after removal of the central portion of the silicon oxide film.

Next, as shown in FIG. 2(f), electrolytic etching (current density 0.2 A/dm$^2$) was effected with 3% aqueous hydrofluoric acid to remove the exposed central circular portion of 7.5 cm in diameter of the silicon wafer 11.

Next, as shown in FIG. 2(g), the silicon oxide film 12 at the exposed portion was removed by use of a mixture of ammonium fluoride and hydrofluoric acid.

Next, as shown in FIG. 2(h), one surface of a ring frame 17 (made of Pyrex, inner diameter 7.5 cm, outer diameter 9 cm, thickness 5 mm) was coated with an epoxy type adhesive 18, and the surface coated with the adhesive was adhered to the side of silicon wafer 11 opposite to that where the aluminum nitride film 14 was formed, followed by removal of the tar type paint layer 19.

Thus, a mask structure for lithography having the laminated product of the polyimide film 13 and the aluminum nitride film 14 fixed on the ring frame 17 and the silicon wafer 11 was obtained.

The masking material holding thin film constituted of the polyimide film and the aluminum nitride film obtained in this Example was found to have particularly good strength.

EXAMPLE 4

The same steps as Example 3 were conducted except for forming a polyester film with a thickness of 2 μm in place of the polyimide film 13 on the silicon oxide film 12 on one side of the silicon wafer 11.

Thus, a mask structure for lithography having the laminated product of the polyester film and the aluminum nitride film fixed on the ring frame and the silicon wafer was obtained.

The masking material holding thin film constituted of the polyester film and the aluminum nitride film obtained in this Example was found to have particularly good strength.

EXAMPLE 5

The same steps as Example 3 were conducted except for forming a poly-p-xylylene film (trade name: Parylene, produced by Union Carbide Co.) with a thickness of 2 μm in place of the polyimide film 13 on the silicon oxide film 12 on one side of the silicon wafer 11.

Thus, a mask structure for lithography having the laminate of the poly-p-xylylene film and the aluminum nitride film fixed on the ring frame and the silicon wafer was obtained.

The masking material holding thin film constituted of the poly-p-xylylene film and the aluminum nitride film obtained in this Example was found to have particularly good strength.

EXAMPLE 6

In the steps of Example 3, after formation of the polyimide film 13 and the aluminum nitride film 14, a layer of a photoresist CMS (chloromethylated polystyrene, produced by Toyo Soda Co.) was formed on the aluminum nitride film 14.

Next, by means of an electron beam picture drawing device, picture drawing of a mask pattern was performed, followed by predetermined treatment to obtain a resist pattern.

Next, by means of an electron beam vapor deposition machine, nickel (Ni) was vapor deposited to a thickness of 0.5 μm on the above resist pattern.

Next, the resist was removed by a remover to obtain a nickel film pattern.

Next, a tar type paint layer for protection was formed on the aluminum nitride film having the nickel film pattern.

Subsequently, the steps as in Example 3 were carried out to obtain a mask structure for lithography having a mask material holding thin film consisting of the laminate of the polyimide film and the aluminum nitride film and the nickel film pattern under the state fixed by the ring frame and the silicon wafer.

The mask material holding thin film having the constitution of the polyimide film and the aluminum film in the mask structure for lithography obtained in this Example was found to have particularly good strength.

EXAMPLE 7

In the steps of Example 4, after formation of the polyester film and the aluminum nitride film, a photoresist CMS layer was formed on the aluminum nitride film.

Subsequently, the same steps as in Example 6 were conducted.

Thus, a mask structure for lithography having a mask material holding thin film, consisting of a laminate of the polyester film and the aluminum nitride film, and the nickel film pattern fixed on the ring frame and the silicon wafer was obtained.

The mask material holding thin film having the constitution of the polyester film and the aluminum nitride film in the mask structure for lithography obtained in this Example was found to have particularly good strength.

EXAMPLE 8

In the steps of Example 5, after formation of the poly-p-xylylene film and the aluminum nitride film, a photoresist CMS layer was formed on the aluminum nitride film.

Subsequently, the same steps as in Example 6 were conducted.

Thus, a mask structure for lithography having a mask material holding thin film, consisting of a laminate of the poly-p-xylylene film and the aluminum nitride film, and the nickel film pattern fixed on the ring frame and the silicon wafer was obtained.

The mask material holding thin film having the constitution of the poly-p-xylylene film and the aluminum film in the mask structure for lithography obtained in this Example was found to have particularly good strength.

EXAMPLE 9

FIGS. 3(a) to (h) are schematic central longitudinal cross-sectional views showing the steps for preparation of an example of the mask structure for lithography according to the present invention.

Figure 3A:
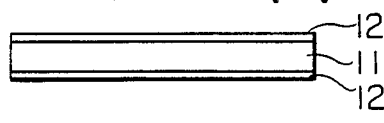

As shown in FIG. 3(a), a silicon oxide film 12 with a thickness of 1 μm was formed on each of both surfaces of a circular silicon wafer 11 of 10 cm in diameter.

Figure 3F:
Figure 3B:
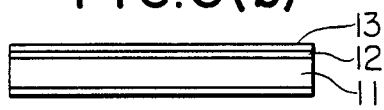

Next, as shown in FIG. 3(b), after PIQ liquid (polyimide precursor, produced by Hitachi Kasei Co.) was applied by spin coating on the silicon oxide film 12 on one side of the silicon wafer 11, the coated film was cured at 50° to 350° C. for 4 hours to form a polyimide film 13 with a thickness of 2 μm.

Figure 3G:
Figure 3C:
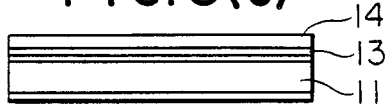

Next, as shown in FIG. 3(c), an aluminum nitride film 14 with a thickness of 1 μm was formed on the polyimide film 13 according to the reactive sputtering method under the condition of an aluminum (Al) target, a gas composition of argon (Ar):nitrogen ($N_2$)=1:1 and a discharging power of 100 W.

Figure 3H:
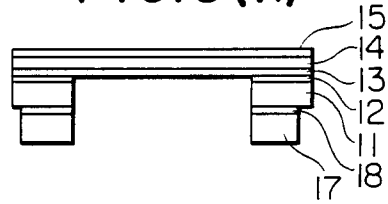
Figure 3D:
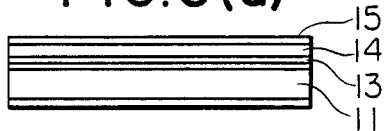

Next, as shown in FIG. 3(d), a polyimide film 15 with a thickness of 2 μm was formed on the aluminum nitride film 14 in the same manner as described above.

Figure 3E:
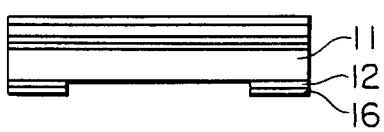

Next, as shown in FIG. 3(e), the exposed central circular portion of 7.5 cm in diameter of the silicon oxide film 12 was removed by use of a mixture of ammonium fluoride and hydrofluoric acid. In this treatment, in order to permit the silicon oxide film 12 to remain in the shape of a ring, a layer of Apiezon wax 16 (produced by Shell Chemical Co.) was formed at that portion, followed by removal of the Apiezon wax layer 16 after removal of the central portion of the silicon oxide film.

Next, as shown in FIG. 3(f), electrolytic etching (current density 0.2 A/dm$^2$) was effected with 3% aqueous hydrofluoric acid to remove the exposed central circular portion of 7.5 cm in diameter of the silicon wafer 11.

Next, as shown in FIG. 3(g), the silicon oxide film 12 at the exposed portion was removed by use of a mixture of ammonium fluoride and hydrofluoric acid.

Next, as shown in FIG. 3(h), one surface of a ring frame 17 (made of Pyrex, inner diameter 7.5 cm, outer diameter 9 cm, thickness 5 mm) was coated with an epoxy type adhesive 18, and the surface coated with the adhesive was adhered to the side of silicon wafer 11 opposite to that where the polyimide films 13, 15 and the aluminum nitride film 14 were formed.

Thus, a mask structure for lithography having the laminate of the polyimide films 13, 15 and the aluminum nitride film 14 fixed on the ring frame 17 and the silicon wafer 11 was obtained.

The masking material holding thin film having the constitution of polyimide film:aluminum nitride film:polyimide film obtained in this Example was found to have particularly good strength and chemical resistance.

EXAMPLE 10

The same steps as Example 9 were conducted except for forming polyester films with a thickness of 2 $\mu$m in place of the polyimide films 13 and 15 on the silicon oxide film 12 on one side of the silicon wafer 11.

Thus, a mask structure for lithography having the laminate of the polyester films and the aluminum nitride film fixed on the ring frame and the silicon wafer was obtained.

The masking material holding thin film constituted of the polyester films and the aluminum nitride film obtained in this Example was found to have particularly good strength and chemical resistance.

EXAMPLE 11

The same steps as Example 9 were conducted except for forming poly-p-xylylene films with a thickness of 2 $\mu$m in place of the polyimide films 13 and 15 on the silicon oxide film 12 on one side of the silicon wafer 11.

Thus, a mask structure for lithography having the laminate of the poly-p-xylylene films and the aluminum nitride film fixed on the ring frame and the silicon wafer was obtained.

The masking material holding thin film constituted of the poly-p-xylylene film:the aluminum nitride film:the poly-p-xylylene film obtained in this Example was found to have particularly good strength and chemical resistance.

EXAMPLE 12

In the steps of Example 9, after formation of the polyimide films 13 and 15 and the aluminum nitride film 14, a layer of a positive type photoresist AZ-1370 (produced by Hoechst Co.) was formed on the polyimide film 15 by spin coating.

Next, after the resist was baked by far UV-ray by use of a quartz mask, predetermined treatment was performed to obtain a resist pattern of negative form relative to the mask.

Next, by means of an electron beam vapor deposition machine, tantalum (Ta) was vapor deposited to a thickness of 0.5 $\mu$m.

Next, the resist was removed with a remover and a Ta film pattern was obtained according to the lift-off method.

Next, a polyimide film with a thickness of 2 $\mu$m for protection was further formed on the polyimide film 15.

Subsequently, the same steps as in Example 9 were carried out to obtain a mask structure for lithography having a mask material holding thin film consisting of an aluminum nitride film and a Ta film pattern fixed on the ring frame and the silicon wafer.

The mask material holding thin film having the constitution of the polyimide film:the aluminum film:the polyimide film in the mask structure for lithography obtained in this Example was found to have particularly good strength.

EXAMPLE 13

According to the same method as in Example 9, a laminate consisting of the five layers of a polyimide film (1 $\mu$m thick), an aluminum nitride film (1 $\mu$m thick), a polyimide film (3 $\mu$m thick), an aluminum nitride film (1 $\mu$m thick) and a polyimide film (1 $\mu$m thick) was formed on the silicon wafer.

Subsequently, the same steps as in Example 9 were carried out to remove the silicon wafer and the central circular portion of the silicon oxide film, further the exposed portion of polyimide film was removed with a hydrazine type solvent and then the ring frame was adhered similarly as in Example 9.

Thus, a mask structure for lithography having a laminate of the three layers of aluminum nitride (1 $\mu$m thick):polyimide film (3 $\mu$m thick):aluminum nitride film (1 $\mu$m thick) fixed on the silicon ring frame and the silicon wafer was obtained.

The mask material holding thin film having a constitution of aluminum nitride film:polyimide film:aluminum nitride film was found to have particularly good heat releasing property.

EXAMPLE 14

The same steps as Example 13 were conducted except for forming polyester films according to the vapor deposition method in place of polyimide films.

Thus, a mask structure for lithography having a laminate of the three layers of aluminum nitride film:polyester film:aluminum nitride film fixed on the silicon ring frame and the silicon wafer was obtained.

The mask material holding thin film having a constitution of aluminum nitride film:polyester film:aluminum nitride film was found to have particularly good heat releasing property.

EXAMPLE 15

The same steps as Example 13 were conducted except for forming poly-p-xylylene films according to the vapor deposition method in place of polyimide films.

Thus, a mask structure for lithography having a laminate of the three layers of aluminum nitride film:poly-p-xylylene film:aluminum nitride film fixed on the silicon ring frame and the silicon wafer was obtained.

The mask material holding thin film having a constitution of aluminum nitride film:poly-p-xylylene film::aluminum nitride film was found to have particularly good heat releasing property.

EXAMPLE 16

FIGS. 4(a) to (h) are schematic central longitudinal cross-sectional views showing the steps for preparation of an example of the mask structure for lithography according to the present invention.

Figure 4A:
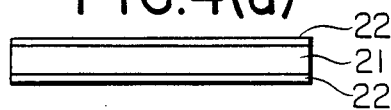

As shown in FIG. 4(a), a silicon oxide film 22 with a thickness of 1 μm was formed on each of both surfaces of a circular silicon wafer 21 of 10 cm in diameter.

Figure 4F:
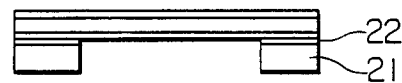
Figure 4B:
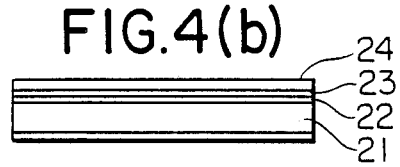

Next, as shown in FIG. 4(b), after a silicon nitride film 23 with a thickness of 0.5 μm was formed according to the plasma CVD method on the silicon oxide film 22 on one side of the silicon wafer 21, an aluminum nitride film 24 with a thickness of 1 μm was formed according to the reactive sputtering method under the condition of an aluminum (Al) target, a gas composition of argon (Ar):nitrogen ($N_2$)=1:1, a gas pressure of $8 \times 10^{-3}$ Torr and a discharging power of 200 W.

Figure 4G:
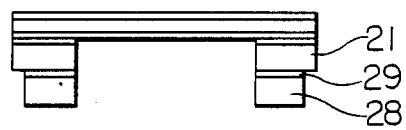
Figure 4C:
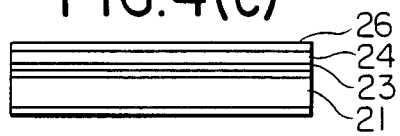

Next, as shown in FIG. 4(c), a tar type paint layer 26 for protection was formed on the aluminum nitride film 24.

Figure 4H:
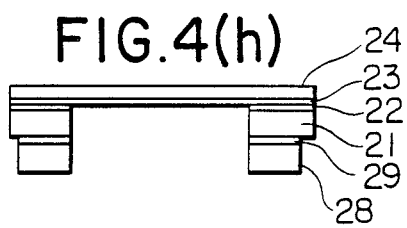
Figure 4D:
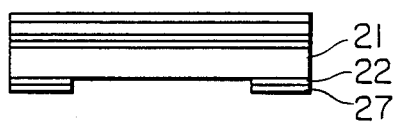

Next, as shown in FIG. 4(d), the exposed central circular portion of 7.5 cm in diameter of the silicon oxide film 22 was removed by use of a mixture of ammonium fluoride and hydrofluoric acid. In this treatment, in order to permit the silicon oxide film 22 to remain in the shape of a ring, a layer of Apiezon wax 27 (produced by Shell Chemical Co.) was formed at that portion, followed by removal of the Apiezon wax layer 27 after removal of the central portion of the silicon oxide film.

Figure 4E:
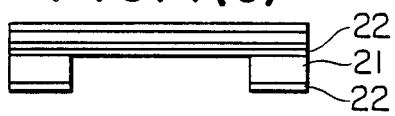

Next, as shown in FIG. 4(e), electrolytic etching (current density 0.2 A/dm$^2$) was effected with 3% aqueous hydrofluoric acid to remove the central circular portion of 7.5 cm in diameter of the silicon wafer 21 exposed.

Next, as shown in FIG. 4(f), the silicon oxide film 22 at the exposed portion was removed by use of a mixture of ammonium fluoride and hydrofluoric acid.

Next, as shown in FIG. 4(g), one surface of a ring frame 28 (made of Pyrex, inner diameter 7.5 cm, outer diameter 9 cm, thickness 5 mm) was coated with an epoxy type adhesive 29, and the surface coated with the adhesive was adhered to the side of silicon wafer 21 opposite to that where the silicon nitride film 23 and the aluminum nitride film 24 was formed.

Next, as shown in FIG. 4(h), the tar type paint layer was removed with acetone.

Thus, a mask structure for lithography having the laminate of the silicon nitride film 23 and the aluminum nitride film 24 fixed on the ring frame 28 and the silicon wafer 21 was obtained.

The masking material holding thin film constituted of the silicon nitride film and the aluminum nitride film obtained in this Example was found to have a particularly good light transmitting property.

EXAMPLE 17

After a silicon oxide film with a thickness of 0.5 μm was formed according to the CVD method on one surface of a circular silicon wafer of 10 cm in diameter, an aluminum nitride film with a thickness of 1 μm was formed on the silicon oxide film in the same manner as in Example 16.

Next, a tar type paint layer for protection was formed on the aluminum nitride film in the same manner as in Example 16.

Next, the central circular portion of 7.5 cm in diameter of the silicon wafer was removed by electrolytic etching in the same manner as in Example 16. In this treatment, in order to permit the silicon wafer to remain in the shape of a ring, a tar type paint layer for protection was formed at that portion, and the tar type paint layer was removed after the central portion of the silicon wafer was removed.

Next, a ring frame was adhered onto the surface of the silicon wafer opposite to that where the silicon oxide film and the aluminum nitride film were formed, followed by removal of the tar type paint layer on the aluminum nitride film.

Thus, a mask structure for lithography having the laminate of the silicon oxide film and the aluminum nitride film fixed on the ring frame and the silicon wafer was obtained.

The masking material holding thin film constituted of the silicon oxide film:aluminum nitride film obtained in this Example was found to have a particularly good light transmitting property.

EXAMPLE 18

In the steps of Example 16, after formation of the silicon nitride film 23 and the aluminum nitride film 24, a tar type paint layer for protection was formed on the aluminum nitride film 24.

Subsequently, in the same manner as in Example 16, the predetermined portion of the silicon oxide film and the central circular portion of the silicon wafer 21 were removed.

Next, the tar type paint layer was removed with acetone.

Next, the aluminum nitride film 24 was coated with photoresist AZ-1370 (produced by Hoechst Co.) thereon.

Next, by use of a stepper, the resist was baked to effect a reducing projection of a mask pattern thereon, followed by a prescribed treatment to obtain a resist pattern.

Next, tantalum (Ta) layer was formed by vapor deposition on the above resist pattern to a thickness of 0.5 μm.

Next, the resist was removed by use of acetone to obtain a tantalum film pattern.

Subsequently, the ring frame was adhered in the same manner as in Example 16 to obtain a mask structure for lithography having a mask material holding thin film consisting of the laminate of the silicon nitride film and the aluminum nitride film and the Ta film pattern fixed on the ring frame and the silicon wafer.

The masking material holding thin film constituted of the silicon nitride film:aluminum nitride film obtained in this Example was found to have a particularly good light transmitting property.

EXAMPLE 19

In the steps of Example 17, after formation of the silicon oxide film and the aluminum nitride film, a tar type paint layer for protection was formed on the aluminum nitride film.

Subsequently, the same steps as in Example 18 were conducted.

Thus, a mask structure for lithography having a mask material holding thin film of the laminate consisting of the silicon oxide film and the aluminum nitride film and a Ta film pattern fixed on the ring frame and the silicon wafer was obtained.

The masking material holding thin film constituted of the silicon oxide film:aluminum nitride film obtained in this Example was found to have a particularly good light transmitting property.

EXAMPLE 20

FIGS. 5(a) to (h) are schematic central longitudinal cross-sectional views showing the steps for preparation of an example of the mask structure for lithography according to the present invention.

Figure 5A:
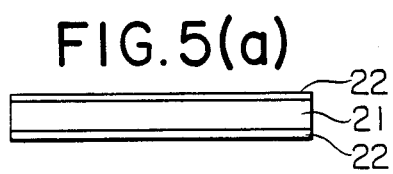

As shown in FIG. 5(a), a silicon oxide film 22 with a thickness of 1 μm was formed on each of both surfaces of a circular silicon wafer 21 of 10 cm in diameter.

Figure 5B:
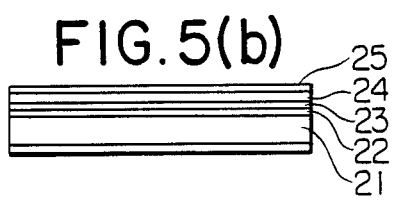

Next, as shown in FIG. 5(b), after a silicon nitride film 23 with a thickness of 0.5 μm was formed according to the plasma CVD method on the silicon oxide film 22 on one side of the silicon wafer 21, an aluminum nitride film 24 with a thickness of 1 μm was formed according to the reactive sputtering method under the condition of an aluminum (Al) target, a gas composition of argon (Ar):nitrogen ($N_2$)=1:1, a gas pressure of $8 \times 10^{-3}$ Torr and a discharging power of 200 W, and further a silicon nitride film 25 with a thickness of 0.5 μm was formed according to the plasma CVD method thereon similarly as described above.

Figure 5C:
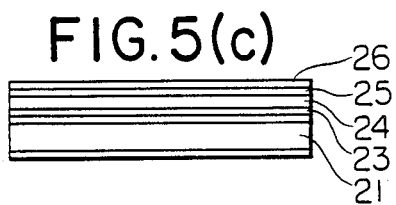

Next, as shown in FIG. 5(c), a tar type paint layer 26 for protection was formed on the silicon nitride film 25.

Figure 5D:
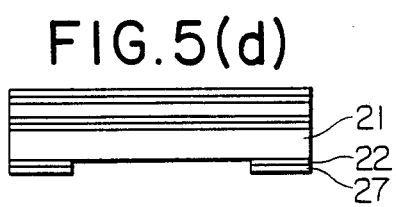

Next, as shown in FIG. 5(d), the central circular portion of 7.5 cm in diameter of the silicon oxide film 22 exposed was removed by use of a mixture of ammonium fluoride and hydrofluoric acid. In this treatment, in order to permit the silicon oxide film 22 to remain in the shape of a ring, a layer of Apiezon wax 27 (produced by Shell Chemical Co.) was formed at that portion, followed by removal of the Apiezon wax layer 27 after removal of the central portion of the silicon oxide film.

Figure 5E:
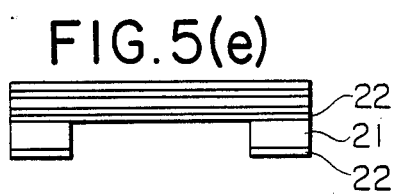

Next, as shown in FIG. 5(e), electrolytic etching (current density 0.2 A/dm$^2$) was effected with 3% aqueous hydrofluoric acid to remove the exposed central circular portion of 7.5 cm in diameter of the silicon wafer 21.

Figure 5F:
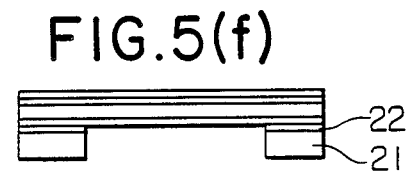

Next, as shown in FIG. 5(f), the silicon oxide film 22 at the exposed portion was removed by use of a mixture of ammonium fluoride and hydrofluoric acid.

Figure 5G:
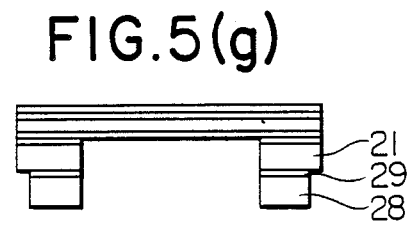

Next, as shown in FIG. 5(g), one surface of a ring frame 28 (made of Pyrex, inner diameter 7.5 cm, outer diameter 9 cm, thickness 5 mm) was coated with an epoxy type adhesive 29, and the surface coated with the adhesive was adhered to the side of silicon wafer 21 opposite to that where the silicon nitride films 23 and 25 and the aluminum nitride film 24 were formed.

Figure 5H:
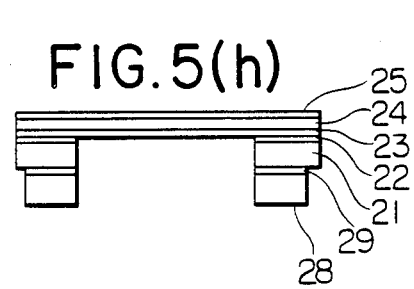

Next, as shown in FIG. 5(h), the tar type paint layer 26 was removed with acetone.

Thus, a mask structure for lithography having the laminate of the silicon nitride films 23 and 25 and the aluminum nitride film 24 fixed on the ring frame 28 and the silicon wafer 21 was obtained.

The masking material holding thin film constituted of the silicon nitride film:the aluminum nitride film:the silicon nitride film obtained in this Example was found to have a particularly good light transmitting property.

EXAMPLE 21

The steps of Example 17 were conducted except for further forming a silicon oxide film with a thickness of 0.5 μm according to the CVD method after formation of an aluminum nitride film and forming a tar type paint layer for protection on the silicon oxide film.

Thus, a mask structure for lithography having the laminate with a constitution of the silicon oxide film:the aluminum nitride film:the silicon oxide film under the state fixed by the ring frame and the silicon wafer was obtained.

The masking material holding thin film constituted of the silicon oxide film:the aluminum nitride film:the silicon oxide film obtained in this Example was found to have a particularly good light transmitting property.

EXAMPLE 22

The steps of Example 16 were conducted except for forming an aluminum nitride film with a thickness of 1 μm before formation of the silicon nitride film 23.

Thus, a mask structure for lithography having the laminate with a constitution of the aluminum nitride film:the silicon nitride film:the aluminum nitride film fixed on the ring frame and the silicon wafer was obtained.

The masking material holding thin film constituted of the silicon nitride film:the aluminum nitride film:the silicon nitride film obtained in this Example was found to have a particularly good heat releasing property.

EXAMPLE 23

The steps of Example 17 were conducted except for forming an aluminum nitride film with a thickness of 1 μm before formation of the silicon oxide film 23.

Thus, a mask structure for lithography having the laminate with a constitution of the aluminum nitride film:the silicon oxide film:the aluminum nitride film fixed on the ring frame and the silicon wafer was obtained.

The masking material holding thin film constituted of the silicon nitride film:the aluminum oxide film:the silicon nitride film obtained in this Example was found to have a particularly good heat releasing property.

EXAMPLE 24

In the steps of Example 20, after formation of the silicon nitride films 23 and 25 and the aluminum nitride 24, a tar type paint layer for protection was formed on the silicon nitride film 25.

Subsequently, in the same manner as in Example 20, the predetermined portion of the silicon oxide film 22 and the central circular portion of the silicon wafer 21 were removed.

Next, the tar type paint layer was removed with acetone.

Next, a layer of photoresist RD-200N (produced by Hitachi Kasei Co.) was formed to a thickness of 1.2 μm by spin coating.

Next, after the resist was baked by far UV-ray by use of a quartz-chromium mask, a prescribed treatment was performed to obtain a resist pattern of negative form relative to the mask.

Next, by means of an electron beam vapor depositing machine, tantalum (Ta) was vapor deposited to a thickness of 0.5 μm.

Next, the resist was removed with a remover and a Ta film pattern was obtained according to the lift-off method.

Subsequently, the ring frame was adhered in the same manner as in Example 20 to obtain a mask structure for lithography having a masking material holding thin film consisting of the laminate of the silicon nitride films and the aluminum nitride film and a tantalum film pattern fixed on the ring frame and the silicon wafer.

The masking material holding thin film constituted of the silicon nitride film:the aluminum nitride film:the silicon nitride film obtained in this Example was found to have a particularly good light transmitting property.

EXAMPLE 25

After silicon oxide films were formed on both surfaces of a silicon wafer in the same manner as in Example 20, an aluminum nitride film was formed in the same manner as in Example 20.

Next, a tar type paint layer for protection was formed on the aluminum nitride film.

Subsequently, in the same manner as in Example 20, the predetermined portion of the silicon oxide film and the central circular portion of the silicon wafer 21 were removed.

Next, the tar type paint layer was removed with acetone.

Next, a chromium (Cr) film with a thickness of 300 A was formed uniformly by means of a resistance heating vapor deposition machine on the aluminum nitride film, and then a gold (Au) film with a thickness of 0.5 μm was uniformly formed.

Next, photoresist AZ-1350 was uniformly applied to a thickness of 0.5 μm on the gold film.

Next, with a master mask placed in close contact on the resist, the resist was baked by use of far UV-ray, followed by a prescribed treatment to obtain a resist pattern of positive form relative to the master mask.

Next, with the use of an iodine ($I_2$) type gold etchant, etching of the gold film was effected to obtain a gold film pattern of positive form relative to the master mask.

Subsequently, the ring frame was adhered in the same manner as in Example 20 to obtain a mask structure for lithography having a masking material holding thin film, consisting of the laminate of the aluminum nitride film and the chromium film, and the gold film pattern fixed on the ring frame and the silicon wafer.

The masking material holding thin film constituted of the aluminum nitride film:the chromium film obtained in this Example was found to have a particularly good X-ray transmitting property.

EXAMPLE 26

Except for forming the aluminum nitride film according to the sputtering method with the use of a sintered aluminum nitride target, the same steps as in Example 25 were conducted to obtain a mask structure for lithography.

In this Example, the film forming speed of the aluminum nitride film was high.

EXAMPLE 27

The steps of Example 17 were repeated except that a PIQ liquid (polyimide precursor, produced by Hitachi Kasei Co.) was applied by spin coating on the aluminum nitride film, followed by curing at 50° to 350° C. for 4 hours to form a polyimide film with a thickness of 2 μm.

Thus, a mask structure for lithography having the laminate with a constitution of the silicon oxide film:the aluminum nitride film the polyimide film fixed on the ring frame and the silicon wafer was obtained.

The masking material holding thin film constituted of the silicon oxide film the aluminum nitride film:the polyimide film obtained in this Example was found to have particularly great strength.

EXAMPLE 28

According to the same method as in Example 27, except for reversing the order of formation of the silicon oxide film and the aluminum nitride film, a mask structure for lithography having the laminate with a constitution of the aluminum nitride film:the silicon oxide film:the polyimide film fixed on the ring frame and the silicon wafer was obtained.

The masking material holding thin film constituted of the aluminum nitride film:the silicon oxide film:the polyimide film obtained in this Example was found to have a particularly great strength.

EXAMPLE 29

According to the same method as in Example 27, except for reversing the order of formation of the aluminum nitride film and formation of the polyimide film, a mask structure for lithography having the laminate with a constitution of the silicon oxide film:the polyimide film:the aluminum nitride film fixed on the ring frame and the silicon wafer was obtained.

The masking material holding thin film constituted of the silicon oxide film:the polyimide film:the aluminum nitride film obtained in this Example was found to have particularly great strength.

EXAMPLE 30

Similarly as in Example 16, this Example is explained by referring to FIG. 4.

As shown in FIG. 4(a), a silicon oxide film 22 with a thickness of 1 μm was formed on each of both surfaces of a circular silicon wafer 21 of 10 μcm in diameter.

Next, as shown in FIG. 4(b), after a boron nitride film 23 with a thickness of 0.5 μm was formed according to the plasma CVD method on the silicon oxide film 22 on one side of the silicon wafer 21, an aluminum nitride film 24 with a thickness of 1 μm was formed according to the reactive sputtering method under the condition of an aluminum (Al) target, a gas composition of argon (Ar):nitrogen ($N_2$) = 1:1, a gas pressure of $8 \times 10^{-3}$ Torr and a discharging power of 200 W.

Next, as shown in FIG. 4(c), a tar type paint layer 26 for protection was formed on the aluminum nitride film 24.

Next, as shown in FIG. 4(d), the exposed central circular portion of 7.5 cm in diameter of the silicon oxide film 22 was removed by use of a mixture of ammonium fluoride and hydrofluoric acid. In this treatment, in order to permit the silicon oxide film 22 to remain in the shape of a ring, a layer of Apiezon wax 27 (produced by Shell Chemical Co.) was formed at that portion, followed by removal of the Apiezon wax layer 27 after removal of the central portion of the silicon oxide film.

Next, as shown in FIG. 4(e), electrolytic etching (current density 0.2 A/dm$^2$) was effected with 3% aqueous hydrofluoric acid to remove the exposed central circular portion of 7.5 cm in diameter of the silicon wafer 21.

Next, as shown in FIG. 4(f), the silicon oxide film 22 at the exposed portion was removed by use of a mixture of ammonium fluoride and hydrofluoric acid.

Next, as shown in FIG. 4(g), one surface of a ring frame 28 (made of Pyrex, inner diameter 7.5 cm, outer diameter 9 cm, thickness 5 mm) was coated with an epoxy type adhesive 29, and the surface coated with the adhesive was adhered to the side of silicon wafer 21 opposite to that where the boron nitride film 23 and the aluminum nitride film 24 were formed.

Next, as shown in FIG. 4(h), the tar type paint layer 26 was removed with acetone.

Thus, a mask structrure for lithography having the laminate of the boron nitride film 23 and the aluminumm nitride film 24 fixed on the ring frame 28 and the silicon wafer 21 was obtained.

The masking material holding thin film constituted of the boron nitride film and the aluminum nitride film obtained in this Example was found to have a particularly good light transmitting property and chemical resistance.

EXAMPLE 31

In the steps of Example 30, after formation of the boron nitride film 23 and the aluminum nitride film 24, a tar type paint layer for protection was formed on the aluminum nitride film 24.

Subsequently, in the same manner as in Example 30, the predetermined portion of the silicon oxide film 22 and the central circular portion of the silicon wafer 21 were removed.

Next, the tar type paint layer was removed with acetone.

Next, the aluminum nitride film 24 was coated with photoresist AZ-1370 (produced by Hoechst Co.) thereon.

Next, by use of a stepper, the resist was baked to effect a reducing projection of a mask pattern thereon, followed by prescribed treatment to obtain a resist pattern.

Next, a tantalum (Ta) layer was formed by vapor deposition on the above resist pattern to a thickness of 0.5 $\mu$m.

Next, the resist was removed by use of acetone to obtain a tantalum film pattern.

Subsequently, the ring frame was adhered in the same manner as in Example 30 to obtain a mask structure for lithography having a mask material holding thin film consisting of the laminate of the boron nitride film and the aluminum nitride film and the Ta film pattern fixed on the ring frame and the silicon wafer.

The masking material holding thin film constituted of the boron nitride film:aluminum nitride film obtained in this Example was found to have a particularly good light transmitting property and chemical resistance.

EXAMPLE 32

Similarly as in Example 20, this Example is explained by referring to FIG. 5.

As shown in FIG. 5(a), a silicon oxide film 22 with a thickness of 1 $\mu$m was formed on each of both surfaces of a circular silicon wafer 21 of 10 cm in diameter.

Next, as shown in FIG. 5(b), after a boron nitride film 23 with a thickness of 0.5 $\mu$m was formed according to the plasma CVD method on the silicon oxide film 22 on one side of the silicon wafer 21, an aluminum nitride film 24 with a thickness of 1 $\mu$m was formed according to the reactive sputtering method under the condition of an aluminum (Al) target, a gas composition of argon (Ar):nitrogen ($N_2$)=1:1, a gas pressure of $8 \times 10^{-3}$ Torr and a discharging power of 200, and further a boron nitride film 25 with a thickness of 0.5 $\mu$m was formed according to the plasma CVD method thereon similarly as described above.

Next, as shown in FIG. 5(c), a tar type paint layer 26 for protection was formed on the boron nitride film 25.

Next, as shown in FIG. 5(d), the exposed central circular portion of 7.5 cm in diameter of the silicon oxide film 22 was removed by use of a mixture of ammonium fluoride and hydrofluoric acid. In this treatment, in order to permit the silicon oxide film 22 to remain in the shape of a ring, a layer of Apiezon wax 27 (produced by Shell Chemical Co.) was formed at that portion, followed by removal of the Apiezon wax layer 27 after removal of the central portion of the silicon oxide film.

Next, as shown in FIG. 5(e), electrolytic etching (current density 0.2 A/dm$^2$) was effected with a 3% aqueous hydrofluoric acid to remove the exposed central circular portion of 7.5 cm in diameter of the silicon wafer 21.

Next, as shown in FIG. 5(f), the silicon oxide film 22 at the exposed portion was removed by use of a mixture of ammonium fluoride and hydrofluoric acid.

Next, as shown in FIG. 5(g), one surface of a ring frame 28 (made of Pyrex, inner diameter 7.5 cm, outer diameter 9 cm, thickness 5 mm) was coated with an epoxy type adhesive 29, and the surface coated with the adhesive was adhered to the side of the silicon wafer 21 opposite to that where the boron nitride films 23, 25 and the aluminum nitride film 24 were formed.

Next, as shown in FIG. 5(h), the tar type paint layer was removed with acetone.

Thus, a mask structure for lithography having the laminate of the boron nitride films 23 and 25 and the aluminum nitride film 24 fixed on the ring frame 28 and the silicon wafer 21 was obtained.

The masking material holding thin film constituted of the boron nitride film:the aluminum nitride film:the boron nitride film obtained in this Example was found to have a particularly good light transmitting property.

EXAMPLE 33

In the steps of Example 32, after formation of the boron nitride films 23 and 25 and the aluminum nitride film 24 a tar type paint layer for protection was formed on the boron nitride film 25.

Subsequently, in the same manner as in Example 32, the predetermined portion of the silicon oxide film 22 and the central circular portion of the silicon wafer 21 were removed.

Next, the tar type paint layer was removed with acetone.

Next, a layer of a photoresist RD-200N (produced by Hitachi Kasei Co.) was formed to a thickness of 1.2 $\mu$m by spin coating.

Next, after the resist was baked by far UV-ray by use of a quartz-chromium mask, a prescribed treatment was performed to obtain a resist pattern of nega type relative to the mask was obtained.

Next, by means of an electron beam vapor depositing machine, tantalum (Ta) was vapor deposited to a thickness of 0.5 $\mu$m.

Next, the resist was removed with a remover and a Ta film pattern was obtained according to the lift-off method.

Subsequently, the ring frame was adhered in the same manner as in Example 32 to obtain a mask structure for lithography having a masking material holding thin film comprising the laminate of the boron nitride films and the aluminum nitride film and a tantalum film pattern fixed on the ring frame and the silicon wafer.

The masking material holding thin film constituted of the silicon nitride film:the aluminum nitride film:the silicon nitride film obtained in this transmitting property and chemical resistance. Example was found to have a particularly good light transmitting property and chemical resistance.

EXAMPLE 34

According to the same method as in Example 32, except that a silicon nitride film was formed in place of formation of the boron nitride film 25 to obtain a mask structure for lithography having a constitution of the boron nitride film:the aluminum nitride film:the silicon nitride film fixed on the ring frame and the silicon wafer.

EXAMPLE 35

According to the same method as in Example 32, except that a silicon nitride film was formed in place of formation of the boron nitride film 23 to obtain a mask structure for lithography having a constitution of the silicon nitride film:the aluminum nitride film:the boron nitride film fixed on the ring frame and the silicon wafer.

EXAMPLE 36

According to the same method as in Example 35, except that the order of formation of the silicon nitride film and formation of the aluminum nitride film was reversed to obtain a mask structure for lithography having a constitution of the aluminum nitride film:the silicon nitride film:the boron nitride film fixed on the ring frame and the silicon wafer.

EXAMPLE 37

According to the same method as in Example 35, except that the order of formation of the aluminum nitride film and formation of the boron nitride film was reversed to obtain a mask structure for lithography having a constitution of the silicon nitride film:the boron nitride film:the aluminum nitride film fixed on the ring frame and the silicon wafer.

EXAMPLE 38

The steps of Example 30 were repeated except that a PIQ liquid (polyimide precursor, produced by Hitachi Kasei Co.) was applied by spin coating on the aluminum nitride film, followed by curing at 50° to 350° C. for 4 hours to form a polyimide film with a thickness of 2 μm.

Thus, a mask structure for lithography having the laminate with a constitution of the boron nitride film:the aluminum nitride film:the polyimide film fixed on the ring frame and the silicon wafer was obtained.

The masking material holding thin film constituted of the boron nitride film:the aluminum nitride film:the polyimide film obtained in this Example was found to have a particularly great strength.

EXAMPLE 39

According to the same method as in Example 38, except for reversing the order of formation of the boron nitride film and formation of the aluminum nitride film, a mask structure for lithography having the laminate with a constitution of the aluminum nitride film:the boron nitride film:the polyimide film fixed on the ring frame and the silicon wafer was obtained.

The masking material holding thin film constituted of the aluminum nitride film:the boron nitride film:the polyimide film obtained in this Example was found to have particularly good strength.

EXAMPLE 40

According to the same method as in Example 38, except for reversing the order of formation of the aluminum nitride film and formation of the polyimide film, a mask structure for lithography having the laminate with a constitution of the boron nitride film:the polyimide film:the aluminum nitride film fixed on the ring frame and the silicon wafer was obtained.

The masking material holding thin film constituted of the boron nitride film:the polyimide film:the aluminum nitride film obtained in this Example was found to have a particularly good strength.

EXAMPLE 41

The same steps as in Example 35 were performed except for forming further a polyimide film with a thickness of 2 μm in the same manner as in Example 40 after formation of the boron nitride film to obtain a mask structure for lithography having the laminate with a constitution of the silicon nitride film:the aluminum nitride film:the boron nitride film:the polyimide film fixed on the ring frame and the silicon wafer was obtained.

The masking material holding thin film constituted of the silicon nitride film:the aluminum nitride film:the boron nitride film:the polyimide film obtained in this Example was found to have particularly good strength.

EXAMPLE 42

The same steps as in Example 30 were performed except for forming an aluminum nitride film with a thickness of 1 μm in the same manner as in Example 30 before formation of the boron nitride film 23.

Thus, a mask structure for lithography having the laminate with a constitution of the aluminum nitride film:the boron nitride film:the aluminum nitride film fixed on the ring frame and the silicon wafer was obtained.

The masking material holding thin film constituted of the aluminum nitride film:the boron nitride film:the aluminum nitride film obtained in this Example was found to have a particularly good light transmitting property and heat releasing property.

EXAMPLE 43

FIGS. 6(a) to (f) are schematic central longitudinal cross-sectional views showing the steps for preparation of an example of the mask structure for lithography according to the present invention.

Figure 6A:
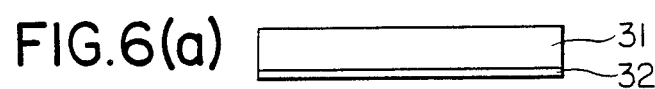
FIG. 6(a)-(f) is a schematic central longitudinal sectional view showing the steps of an example of the process for preparing the mask structure for lithography of the present invention.

As shown in FIG. 6(a), after a PIQ liquid (polyimide precursor, produced by Hitachi Kasei Co.) was applied by spin coating on one surface of a circular silicon wafer 31 of 10 cm in diameter, the coated film was cured at 50°–350° C. for 4 hours to form a polyimide film 32 with a thickness of 1.5 μm.

Figure 6B:
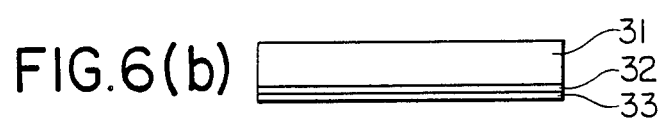

Next, as shown in FIG. 6(b), an aluminum nitride film 33 with a thickness of 3 μm was formed on the polyimide film 32 according to the reactive sputtering method under the condition of an aluminum (Al) target, a gas composition of argon (Ar):nitrogen ($N_2$)=1:1, a gas pressure of $5 \times 10^{-3}$ Torr and a discharging power of 200 W.

Figure 6C:
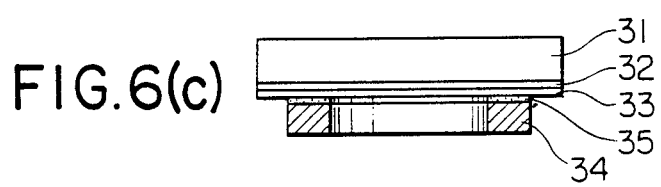

Next, as shown in FIG. 6(c), one surface of a ring frame 34 (made of Pyrex, inner diameter 7.5 cm, outer diameter 9 cm, thickness 5 mm) was coated with an epoxy type adhesive 35, and the surface of the above aluminum nitride film 33 was adhered to the surface on which the adhesive was coated.

Figure 6D:
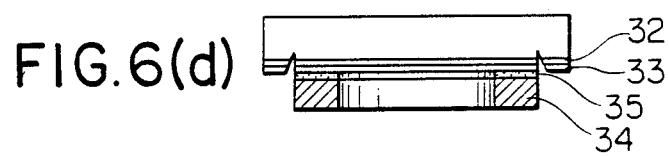

Next, as shown in FIG. 6(d), cuttings were formed into the aluminum nitride film and the polyimide film along the outer circumference of the ring frame 34.

Figure 6E:
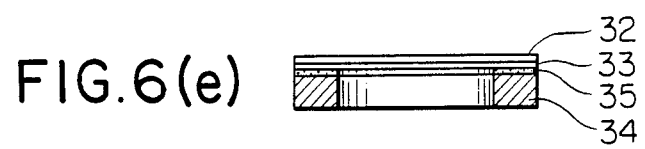

Next, as shown in FIG. 6(e), the silicon wafer was separated and removed by permitting ultrasonic wave to act thereon in an aqueous solution in which a surfactant (sodium alkylbenzenesulfonate) was added.

Figure 6F:
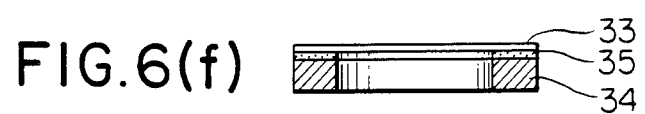

Next, as shown in FIG. 6(f), the polyimide film 32 was removed by a hydrazine type solvent. In this treatment with the solvent, a tar type paint was applied on the aluminum nitride film 33 for protection thereof, and the tar type paint layer was removed with acetone after removal of the polyimide film 32.

Thus, a mask structure for lithography having the aluminum nitride film 33 fixed on the ring frame 34 was obtained.

EXAMPLE 44

On the aluminum nitride film 33 of the mask structure for lithography obtained in Example 43, a gold (Au) film with a thickness of 0.5 $\mu$m was formed uniformly by means of a resistance heating vapor deposition machine.

Next, photoresist AZ-1350 (produced by Hoechst Co.) was uniformly applied to a thickness of 0.5 $\mu$m on the gold film.

Next, with a master mask placed in close contact on the resist, the resist was baked by use of far UV-ray, followed by prescribed treatment to obtain a resist pattern of positive type relative to the master mask.

Next, with the use of an iodine ($I_2$) type gold etchant, etching of the gold film was effected to obtain a gold film pattern of positive form relative to the master mask.

Next, the resist was removed with a ketone type solvent.

Thus, a mask structure for lithography having the aluminum nitride film on which the gold pattern is formed fixed on the ring frame was obtained.

EXAMPLE 45

The same steps of Example 43 were repeated except that the polyimide film 32 was not removed.

Thus, a mask structure for lithography having the laminate of the polyimide film and aluminum nitride film fixed on the ring frame was obtained.

EXAMPLE 46

In the steps of Example 43, after formation of the aluminum nitride film 33, a gold (Au) film with a thickness of 0.5 $\mu$m was formed uniformly on the aluminum nitride film 33 by means of a resistance heating vapor deposition machine.

Next, a photoresist AZ-1350 (produced by Hoechst Co.) was uniformly applied to a thickness of 0.5 $\mu$m on the gold film.

Next, with a master mask placed in close contact on the resist, the resist was baked by use of far UV-ray, followed by prescribed treatment to obtain a resist pattern of positive form relative to the master mask.

Next, with the use of an iodine ($I_2$) type gold etchant, etching of the gold film was effected to obtain a gold film pattern of positive form relative to the master mask.

Next, after the resist was removed with a ketone type solvent, one surface of a ring frame (made of Pyrex, inner diameter 7.5 cm, outer diameter 9 cm, thickness 5 mm) was coated with an epoxy type adhesive in the same manner as in Example 43 and the surface of the above aluminum nitride film was adhered to the surface on which the adhesive was coated.

Subsequently, in the same manner as in Example 43, cuttings were formed on the aluminum nitride film and the polyimide film along the outer circumference of the ring frame, and the silicon wafer was separated and removed by permitting ultrasonic wave to act thereon in an aqueous solution in which a surfactant (sodium alkylbenzenesulfonate) was added.

Thus, a mask structure for lithography having the laminate of the polyimide film and the aluminum nitride film, on which the gold film pattern was formed, fixed on the ring frame was obtained.

EXAMPLE 47

On both surfaces of a circular silicon wafer of 10 cm in diameter, silicon oxide films with a thickness of 1 $\mu$m were formed.

Next, after an aluminum nitride film with a thickness of 2 $\mu$m was formed on the silicon oxide film on one side of the wafer according to the reactive sputtering method under the condition of an aluminum (Al) target, a gas composition of argon (Ar):nitrogen ($N_2$)=1:1, a gas pressure of $8 \times 10^{-3}$ Torr and a discharging power of 300 W, a boron nitride film with a thickness of 2 $\mu$m was formed on the aluminum nitride film according to the same sputtering method except for using a boron nitride target.

Next, the ring frame was adhered in the same manner as in Example 43, and subsequently the same steps of Example 43 were repeated to separate and remove the silicon wafer attached with the silicon oxide films.

Thus, a mask structure for lithography having the laminate of the aluminum nitride film and the boron nitrode film fixed on the ring frame was obtained.

EXAMPLE 48

The same steps of Example 47 were repeated except that an aluminum nitride film with a thickness of 1 $\mu$m was further formed according to the reactive sputtering method after formation of the boron nitride film.

Thus, a mask structure for lithography having the laminate with a constitution of the aluminum nitride film:boron nitrode film aluminum nitride film fixed on the ring frame was obtained.

The mask structures for lithography of the present invention as described above in Examples 43–48 further have the effects of simple and rapid preparation steps as well as good yield, in addition to the effect obtained by using a layer of aluminum nitride as the constituent element of the mask material holding thin film.

EXAMPLE 49

FIG. 7(a) is a schematic central longitudinal cross-sectional view of an example of the mask structure for lithography according to the present invention, and FIG. 7(b) is a schematic plan view of the ring frame of the mask structure for lithography. In FIG. 7, 42 is a mask material holding thin film, and the peripheral portion of the mask material holding thin film 42 is supported on the upper end surface of the ring frame 43.

The above mask holding thin film 42 may be made of a single layer of aluminum nitride or a laminate of aluminum nitride and another inorganic and/or organic material.

In the mask structure for lithography in this Example, the uppermost flat end surface 43a of the mask frame 43 is not coated with an adhesive for adhering the mask material holding thin film, rather only the slanted surface 43b extending therefrom at an angle θ around the outside of the uppermost flat surface 43a is coated with the adhesive 44. The angle θ is not particularly limited, except that it is a value exceeding 0 degrees, but preferably 5 to 90 degrees, more preferably 5 to 60 degrees, and optimally 5 to 30 degree.

As the above adhesive 44, there may be employed, for example, solvent type adhesives (butadiene type synthetic rubber adhesives, chloroprene type synthetic rubber adhesives, etc.) or non-solvent type adhesives (epoxy type adhesives, cyanoacrylate type adhesives, etc.).

FIGS. 8(a)–(g) show the steps for preparing an example of the mask structure for lithography of the present invention as shown in FIG. 7.

Figure 8A:
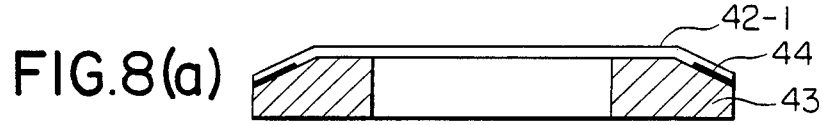
FIG. 8(a)-(g) is a schematic central longitudinal sectional view showing the preparation steps of an example of the mask structure for lithography according to the present invention.

As shown in FIG. 8(a), the slanted plane portion of the ring frame 43 (produced by Pyrex Co., inner diameter 7.5 cm, outer diameter 9 cm, thickness 5 mm; at the outside of the uppermost flat end surface, a slanted surface connected to said flat end surface by an angle of 15 degrees being formed) is coated with the epoxy type adhesive 44, a polyimide film 42-1 (thickness 7 μm) stretched isotropically was fixed by adhesion through the epoxy type resin 44 to the ring frame 43, and the polyimide film 42-1 protruding out of the ring frame 43 was cut off.

Figure 8B:
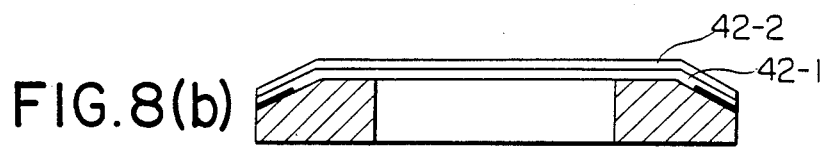

Next, as shown in FIG. 8(b), on the polyimide film 42-1, an aluminum nitride film 42-2 with a thickness of 3 μm was formed according to the reactive sputtering method under the condition of an aluminum (Al) target, a gas composition of argon (Ar):nitrogen ($N_2$)=1:1, a gas pressure of $5 \times 10^{-3}$ Torr and a discharging power of 200 W.

Figure 8C:
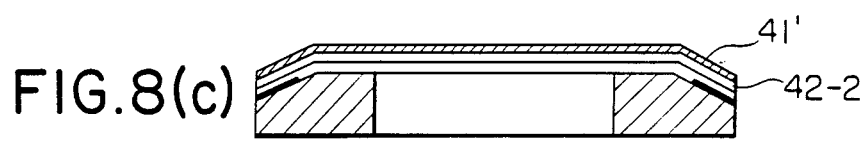

Next, as shown in FIG. 8(c), a gold (Au) film 41 with a thickness of 0.5 μm was formed uniformly by means of a resistance heating vapor deposition machine.

Figure 8D:
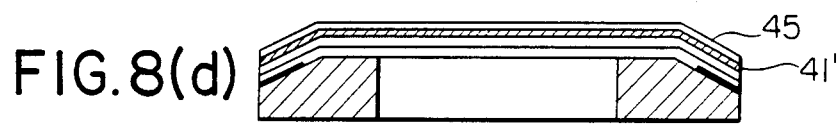

Next, as shown in FIG. 8(d), a photoresist AZ-1350 (produced by Hoechst Co.) was uniformly applied to a thickness of 0.5 μm on the gold film 41.

Figure 8E:
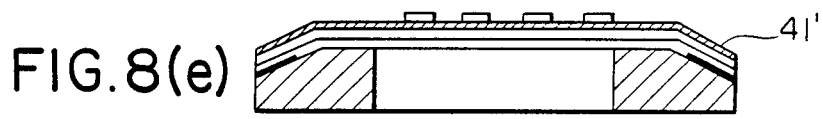

Next, as shown in FIG. 8(e), with a master mask placed in close contact on the resist, the resist was baked by use of far UV-ray, followed by prescribed treatment to obtain a resist pattern of positive form relative to the master mask.

Figure 8F:
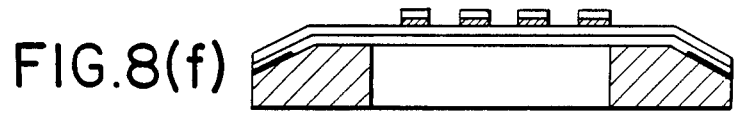

Next, as shown in FIG. 8(f), with the use of an iodine ($I_2$) type gold etchant, etching of the gold film 41 was effected to obtain a gold film pattern of positive form relative to the master mask.

Figure 8G:
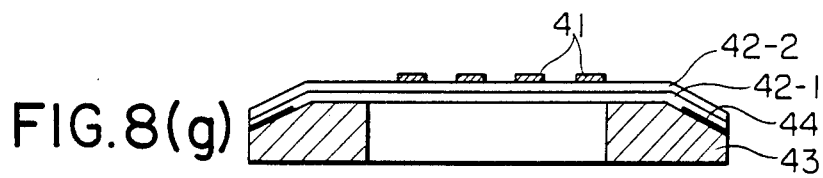

Next, the resist was removed with a ketone type solvent to form a mask pattern 41 consisting of a gold film and, as shown in FIG. 8(g), a mask structure for lithography having the laminate of the polyimide film 42-1 and the aluminum nitride film 42-2 as the mask material holding thin film and a mask pattern 41 formed on said mask material holding thin film was obtained.

EXAMPLE 50

The steps of Example 49 were repeated except that, after formation of the aluminum nitride film 42-2, the exposed portion of the polyimide film 42-1 was removed according to the reactive ion etching method in an oxygen plasma and then a gold film 41′ was formed on the aluminum nitride film 42-2.

Thus, a mask structure for lithography having the aluminum nitride film 42-2 as the mask material holding thin film and a mask pattern formed on said mask material holding thin film was obtained.

EXAMPLE 51

Figure 9:
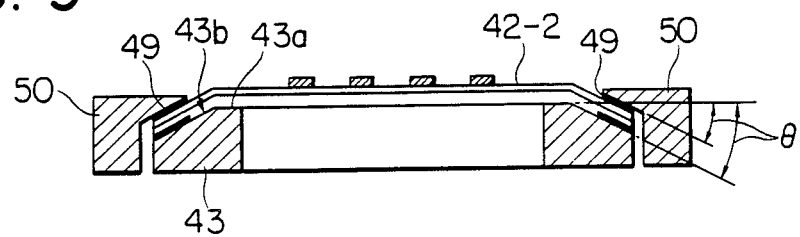
FIG. 9 is a schematic central longitudinal sectional view showing an example of the mask structure for lithography according to the present invention.

FIG. 9 is a schematic central longitudinal cross-sectional view of an example of the mask structure for lithography according to the present invention. On the aluminum nitride film 42-2 on the upper slanted surface 43b of the ring frame 43 of the mask structure for lithography obtained in Example 49, a press ring 50 was further adhered through an adhesive 49 as shown in FIG. 9. The adhesion interface between the press ring 50 and the aluminum nitride film 42-2 was formed in parallel to the upper slanted surface 43b of the ring frame 43.

In the mask structure for lithography in this Example, the mask material holding thin film can be supported more firmly by supporting with a pressure applied between the ring frame 43 and the press ring 50.

In the above Examples, a slanted surface 43b is formed on the outside of the uppermost flat end surface 43a of the ring frame 43, and is connected to the uppermost flat end surface 43a by a certain angle, and adhesion is effected at the slanted surface 43b, but the mask structure for lithography is not limited to such an embodiment.

Figure 10A:
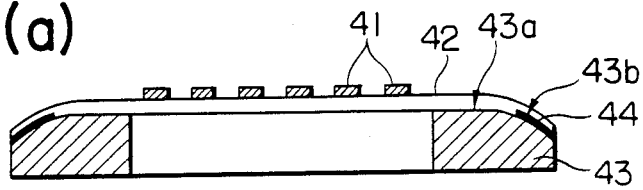
FIG. 10(a) is a schematic central longitudinal sectional view showing an example of the mask structure for lithography according to the present invention.
Figure 10B:
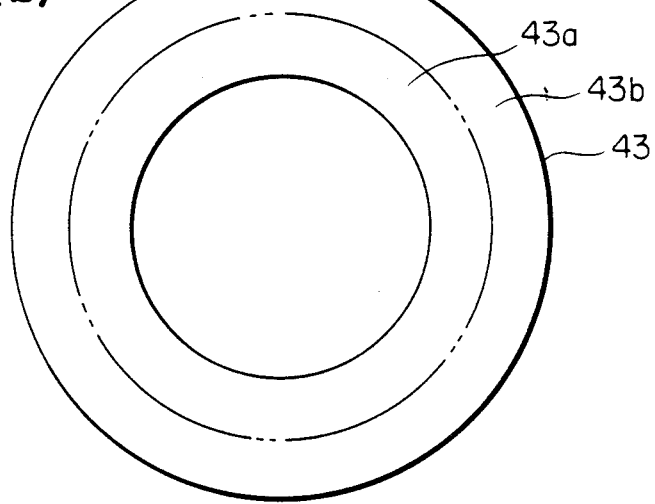
FIG. 10(b) is a schematic plan view of the ring frame of the mask structure for lithography.

FIG. 10(a) is a schematic central longitudinal cross-sectional view of an example of the mask structure for lithography according to the present invention for showing another shape of the ring frame 43, and FIG. 10(b) is a schematic plan view of the ring frame 43. Here, on the outside of the uppermost flat end surface 43a of the ring frame 43, a slanted surface 43b connected smoothly to the uppermost flat end surface 43a is formed, and adhesion is effected at the slanted surface 43b.

Figure 11:
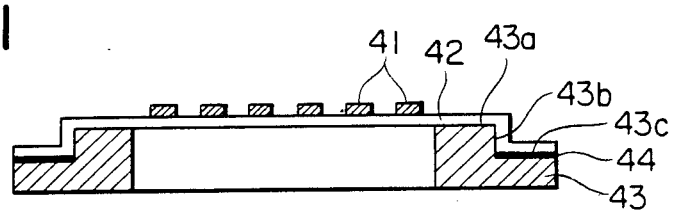
FIG. 11 is a schematic central longitudinal sectional view showing an example of the mask structure for lithography according to the present invention.

FIG. 11 a schematic central longitudinal cross-sectional view of an example of the mask structure for lithography according to the present invention for showing still another shape of the ring frame 43. Here, on the outside of the uppermost flat end surface 43a of the ring frame 43, a surface 43b connected by a right angle to the uppermost flat end surface 43a is formed, a surface 43c is further formed to be connected to the surface 43b at a position lower than the above uppermost flat end surface 43a, and adhesion is effected at the surface 43c.

The mask structure for lithography as described in the above Examples 49-51, in addition to the effect obtained by using a layer of aluminum nitride as the constituent element of the mask material holding thin film, has further the effect of practicing still better lithography, since the flatness of the surface of the mask material holding thin film can further be improved.

According to the present invention as described above, the aluminum nitride used as the constituting element of the mask material holding thin film has specific features of high X-ray transmittance and visible light transmittance (about 0.1 to optical density through 1 um thickness), low coefficient of thermal expansion ($3-4 \times 10^{-6}$/°C.) and good film forming property, and therefore the following effects can be obtained:

(1) Preparation of an excellent mask material holding thin film can be easily effected, because aluminum nitride provides a relatively high amount of X-ray transmittance, even when the film thickness is made relatively thicker.

(2) The good film forming property of aluminum nitride enables preparation of a mask material holding thin film consisting of a very thin film, whereby the amount of X-ray transmitted can be enhanced to improve throughput of baking.

(3) High transmittance of visible light through aluminum nitride enables easy and accurate alignment by observation with eyes by use of visible light in lithography.

(4) Since the coefficient of thermal expansion of aluminum nitride is approximately the same value as the silicon wafer baked substrate ($2-3 \times 10^{-6}/°C$.) in lithography, baking of very high precision is rendered possible.

(5) High thermal conductivity of aluminum nitride can prevent temperature elevation by X-ray irradiation, the effect of which can be particularly high during baking in vacuum.

(6) In the case of using a laminate of a layer of aluminum nitride and a layer of an organic material as the mask material holding thin film, a mask material holding thin film having the characteristics of the organic material in addition to the characteristics of aluminum nitride as described above can be obtained. That is, such a mask material holding thin film, in addition to the effect possessed by the mask material holding thin film, has also the effects of greater strength and substantial absence of stress.

(7) In the case of using a laminate of a layer of aluminum nitride and a layer of an inorganic material different from aluminum nitride as the mask material holding thin film, a mask material holding thin film having the characteristics of the inorganic material in addition to the characteristics of aluminum nitride as described above can be obtained. That is, such a mask material holding thin film has also excellent light transmittance and thermal conductivity as well as relatively great strength and chemical resistance. Also, when a layer of an organic material is further laminated thereto, the specific features such as greater strength and substantial absence of stress are added.

What is claimed is:

1. A mask structure for lithography having a ring frame holding the periperal portion of a thin film for holding a mask material, said mask material holding thin film comprising at least one layer of aluminum nitride.

2. A mask structure according to claim 1, wherein said mask material holding thin film further comprises at least one laminate layer of an organic material.

3. A mask structure according to claim 2, wherein said organic material is a polyimide.

4. A mask structure according to claim 2, wherein said organic material is a polyamide.

5. A mask structure according to claim 2, wherein said organic material is a polyester.

6. A mask structure according to claim 2, wherein said organic material is a poly-p-xylylene.

7. A mask structure according to claim 1, wherein said mask material holding thin film further comprises at least one laminate layer of an inorganic material different from aluminum nitride.

8. A mask structure according to claim 7, wherein said inorganic material is boron nitride.

9. A mask structure according to claim 7, wherein said inorganic material is silicon nitride.

10. A mask structure according to claim 7, wherein said inorganic material is silicon oxide.

11. A mask structure according to claim 7, wherein said inorganic material is silicon carbide.

12. A mask structure according to claim 7, wherein said inorganic material is titanium.

13. A mask structure according to claim 1, wherein said mask material holding thin film further comprises at least one laminate layer of an organic material and at least on laminate layer of an inorganic material different from aluminum nitride.

14. A mask structure according to claim 13, wherein said organic material is a polyimide.

15. A mask structure according to claim 13, wherein said organic material is a polyamide.

16. A mask structure according to claim 13, wherein said organic material is a polyester.

17. A mask structure according to claim 13, wherein said organic material is a poly-p-xylylene.

18. A mask structure according to claim 13, wherein said inorganic material is boron nitride.

19. A mask structure according to claim 13, wherein said inorganic material is silicon nitride.

20. A mask structure according to claim 13, wherein said inorganic material is silicon oxide.

21. A mask structure according to claim 13, wherein said inorganic material is silicon carbide.

22. A mask structure according to claim 13, wherein said inorganic material is titanium.

23. A mask structure according to claim 1, wherein the material of said ring frame is selected from a group consisting of silicon, glass, quartz, phosphor bronze, brass, nickel and stainless steel.

24. A mask structure according to claim 1, wherein said mask material holding thin film is adhered to said ring frame at a position lower than the uppermost flat end plane of said ring frame.

25. A mask structure according to claim 1, further comprising a mask material applied as a laminate thin film to said mask material holding thin film.

26. A mask structure according to claim 25, wherein said mask material is selected from a group consisting of gold, platinum, nickel, palladium, rhodoum, indium, tungsten, tantalum and copper.

27. A mask structure according to claim 25, wherein said mask material is formed in accordance with a pattern.

28. A lithographic method, which comprises using a mask structure for lithography as defined in claim 27.

29. A process for preparing a mask holding structures for lithography, comprising the steps of:
forming a mask material holding thin film comprising a layer of aluminum nitride on a substrate;
adhering a ring frame to said mask material holding thin film; and
removing said substrate from said mask material holding thin film.

30. A process according to claim 29, further comprising the step of applying a mask material in the form of a thin film laminate to said mask material holding thin film.

31. A process according to claim 30, further comprising the step of forming said mask material in accordance with a pattern.

32. A process according to claim 29, wherein the step of removing said substrate from said mask material holding thin film comprises permitting an ultrasonic wave to act thereon in a solvent.

* * * * *

UNITED STATES PATENT AND TRADEMARK OFFICE
CERTIFICATE OF CORRECTION

PATENT NO. : 4,677,042

DATED : June 30, 1987

INVENTOR(S) : HIDEO KATO, ET AL

It is certified that error appears in the above-identified patent and that said Letters Patent is hereby corrected as shown below:

COLUMN 2

Line 18, "erably," should read --erably--.
Line 19, "Presentation" should read --Preparation--.

COLUMN 3

Line 44, "performances" should read --performance--.

COLUMN 4

Line 21, "nitride at least one," should read --nitride, at least one--.

COLUMN 14

Line 44, "nitride" should read --nitride film--.

COLUMN 15

Line 22, "300 A" should read --300 $\text{Å}$--.
Line 65, "film the" should read --film: the--.
Line 68, "film the" should read --film: the--.

COLUMN 16

Line 35, "10 $\mu$cm" should read --10 cm--.

UNITED STATES PATENT AND TRADEMARK OFFICE
CERTIFICATE OF CORRECTION

PATENT NO. : 4,677,042

DATED : June 30, 1987

INVENTOR(S) : HIDEO KATO, ET AL

It is certified that error appears in the above-identified patent and that said Letters Patent is hereby corrected as shown below:

COLUMN 17

Line 7,    "structrure" should read --structure--.
    Lines 8-9,   "aluminumm" should read --aluminum--.
    Line 65,   "200," should read --200 W,--.

COLUMN 18

Line 42,   "film 24" should read --film 24,--.

COLUMN 19

Lines 3-4,   "transmitting property and chemical resistance." should be deleted.

COLUMN 22

Line 47,   "nitrode" should read --nitride--.

COLUMN 23

Line 8,   "but" should be deleted.
    Line 10,   "degree." should read --degrees.--.
    Line 41,   "AZ-1350" should read --AZ-1350 45--.

COLUMN 25

Line 44,   "periperal" should read --peripheral--.

UNITED STATES PATENT AND TRADEMARK OFFICE
CERTIFICATE OF CORRECTION

PATENT NO.  : 4,677,042
DATED       : June 30, 1987
INVENTOR(S) : HIDEO KATO, ET AL It is certified that error appears in the above-identified patent and that said Letters Patent is hereby corrected as shown below:

COLUMN 26

Line 8,   "on" should read --one--.
Line 41,  "rhodoum" should read --rhodium--.
Line 48,  "structures" should read --structure--.

Signed and Sealed this

Fifth Day of January, 1988

Attest:

DONALD J. QUIGG

Attesting Officer         Commissioner of Patents and Trademarks